United States Patent [19]

Akehurst

[11] 4,349,814

[45] Sep. 14, 1982

[54] ELECTRIC SWITCHES

[75] Inventor: Douglas J. Akehurst, Hythe, England

[73] Assignee: Duraplug Electricals Limited, Broadstairs, England

[21] Appl. No.: 193,639

[22] Filed: Oct. 3, 1980

[30] Foreign Application Priority Data

Oct. 8, 1979 [GB] United Kingdom ................ 7934846

[51] Int. Cl.³ ...................... G08B 19/00; H01L 29/82
[52] U.S. Cl. .................................... 340/679; 307/116;
324/251; 335/206; 335/207; 338/32 H;
340/644; 340/686; 361/179
[58] Field of Search ............... 340/644, 661, 679, 686;
338/32 H; 335/206, 207; 324/251; 307/116;
361/179, 190

[56] References Cited

U.S. PATENT DOCUMENTS

| 3,419,798 | 12/1968 | Walton | 340/686 X |
| 3,473,109 | 10/1969 | Maaz et al. | 340/686 X |
| 3,558,934 | 1/1971 | Dorsch et al. | 324/251 X |
| 3,657,686 | 4/1972 | Masuda et al. | 338/32 H |
| 3,680,026 | 7/1972 | Masuda et al. | 338/32 H |
| 3,718,920 | 2/1973 | Grenier | 340/661 X |
| 4,199,741 | 4/1980 | Serrus Paulet | 335/207 X |

Primary Examiner—John W. Caldwell, Sr.
Assistant Examiner—Joseph E. Nowicki
Attorney, Agent, or Firm—Watson, Cole, Grindle & Watson

[57] ABSTRACT

An electrical switching device for use on machinery to prevent machine operation unless safety guards or the like are correctly positioned comprises two separate parts one part including at least two Hall effect devices which respond to magnetic poles of opposite polarity and electronic switching means which is actuated only when all the Hall effect devices are triggered simultaneously, and the other part including a corresponding number of magnets positioned to actuate the respective Hall effect devices when the two switch parts are placed in close proximity and predetermined orientation. The switch is substantially tamper proof and a control circuit can detect any unauthorized attempt to override the switch.

9 Claims, 4 Drawing Figures

ELECTRIC SWITCHES

BACKGROUND OF THE INVENTION

1. Field of the Invention

This invention is concerned with electrical switches, and in particular safety switches suitable, for example, for use in safety equipment associated with machinery to prevent a machine being operated when a machine guard intended for the protection of operating personnel is not properly positioned.

2. Prior Art

It is well known to provide industrial machines with safety equipment of the kind described briefly above. The equipment may include an electric switch arranged to disable the machine when the guard is not in its correct position. One form of switch in common use is a micro switch which utilizes a mechanical toggle action. However, with such switches great care is required at the design stage to ensure that the switch cannot be easily over-ridden by a machine operator to allow the machine to run in an unsafe condition.

In an attempt to avoid the drawback of mechanically operated switches it has been proposed to use a switch which is actuable by a permanent magnet. However, it has been realized that such a switch can be over-ridden with considerable ease.

SUMMARY OF THE INVENTION

An object of the present invention is to provide a switch which avoids the limitations of these known switches by providing a switch which is virtually impossible to over-ride.

According to the present invention there is provided an electrical switching device comprising two parts, one part incorporating at least two Hall effect devices and electronic switching means arranged to be actuated only when signals are emitted simultaneously by the Hall effect devices, and the other part including magnetic pole means for actuating the respective Hall effect devices when said one and other parts are placed together in close proximity and predetermined relationship to each other.

In a preferred embodiment of the invention, two Hall effect devices are reversed in physical location to each other so that they respond to magnetic poles of opposite polarity.

The switches according to the invention are in effect coded and very much more difficult to over-ride than the switches belonging to the prior art. The greater the number of the Hall effect devices and the more complex their arrangement the more secure the device becomes against unauthorised switching.

BRIEF DESCRIPTION OF THE DRAWINGS

A better understanding of the invention will be had from the following description which is given, by way of example, with reference to the accompanying drawings, in which.

DETAILED DESCRIPTION

Figure 1:
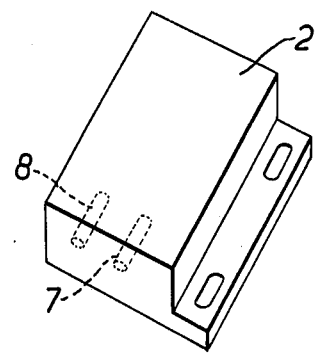
FIG. 1 is a perspective view of the switch embodying the invention.
Figure 1:
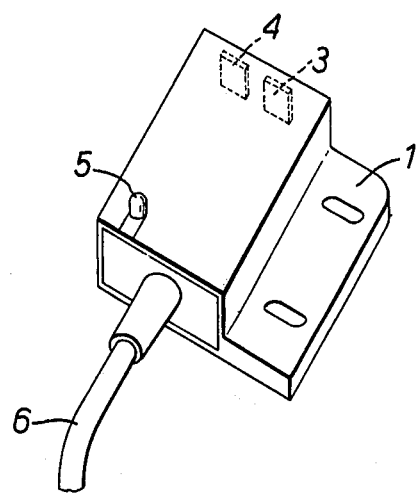

The switch illustrated in FIG. 1 has two parts 1,2 a first one of which includes a plastics housing containing two Hall effect devices 3,4 and electronic circuitry including a light emitting diode 5 which provides a visual indication of the switch condition. An electric cable 6 is connected to the part 1 for supplying power to the electronic circuit and transmitting the output signal from the switch. The Hall effect devices 3,4 are positioned next to each other adjacent to one end face of the plastics housing, the device 3 facing outwardly to be responsive to a magnetic (south) pole whereas the device 4 faces inwardly to be responsive to a magnetic (north) pole.

The second part 2 of the switch has a plastic casing containing two small permanent bar magnets 7,8 fixed firmly in place by an epoxy resin potting compound. The magnets are reversed with respect to each other so that magnet 7 presents its north pole and magnet 8 present its south pole to an adjacent end face of the switch part 2. The magnets 7,8 are so positioned that when the two switch parts 1,2 are placed together they are aligned with the two Hall effect devices 3 and 4, respectively for actuating these devices.

Figure 2:
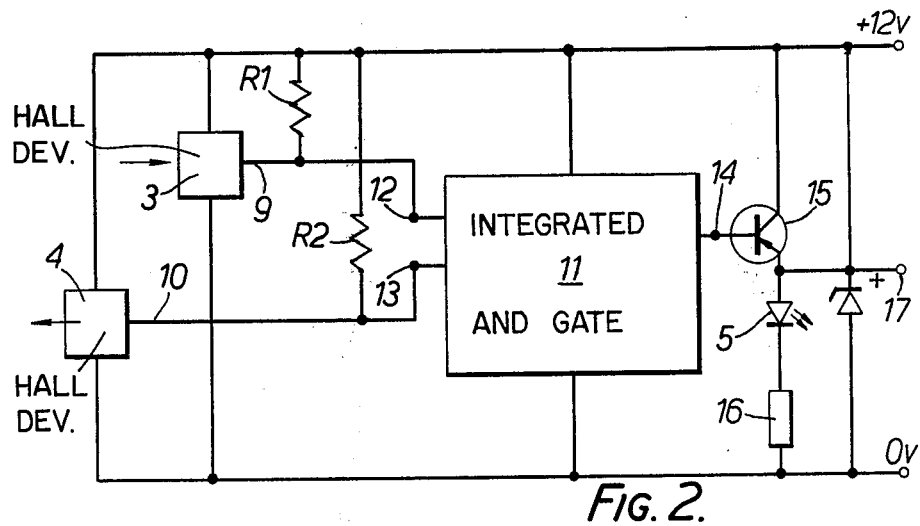
FIG. 2 is a diagram showing the electronic circuit incorporated in the switch of FIG. 1.

The circuit contained within the main switch part 1 is illustrated diagrammatically in FIG. 2. The Hall effect devices 3,4 are connected in parallel across a low D.C. voltage source. The outputs 9,10 of the Hall effect devices are connected to the positive side of the D.C. supply by respective resistors $R_1$ and $R_2$ and to respective input terminals 12,13 of an integrated circuit 11 which is commercially available and connected across the D.C. source in parallel to the Hall effect devices 3,4. The integrated circuit functions as an AND gate and produces a signal at its output 14 only when signals are being received at both input terminals 12,13. The output of the integrated circuit is connected to the base of a power transistor 15 which acts as a switch. The collector of transistor 15 is connected to the positive side of the D.C. supply while the emitter is connected to the other side of the supply through the light emitting diode 5 and a resistor 16, and to the output terminal 17.

In use of the switch on a machine, the part 1 can be mounted on a stationary part of the machine and the other part 2 mounted for movement with the machine guard and to be in close proximity to switch part 1 when the guard assumes its intended position during machine operation. The switch is connected electrically by the cable 6 to a control device so that the machine can only be operated when an output is obtained from terminal 17 of the switch. When the two switch parts are separated from each other the Hall effect devices are unactuated and do not emit any signals to the inputs 12,13 of the integrated circuit 11 and, as a result no control signal is transmitted to the base of transistor 15 which remains in a non-conducting state. There is no signal at the output terminal 16 and the light emitting diode 5 is not illuminated.

If the switch parts 1,2 are brought into juxtaposition and proper alignment by closing the machine guard, the Hall effect devices 3,4 are actuated by the magnets 7,8 and emit signals to the integrated circuit which provides an output to the transistor 15 causing it to switch over to a conductive state. Current flows through the light emitting diode 5 which is illuminated to indicate that the switch has closed. The control device of the machine responds to the voltage signal at the output terminal 17 to allow machine operation.

The described electric switch can be constructed so that the two parts must be in close proximity, for example within a few millimeters, before it operates. Because magnetic poles of opposite polarity are required and must be positioned in a well defined arrangement for the switch to operate it is very difficult for a person to over-ride the safety switch by unauthorised switching. Additional Hall effect devices and magnets could be used and the switch coding becomes more and more difficult to break as the number and the complexity of their arrangement increases.

As described above the switch is a low voltage D.C. switch, but it can be readily adapted to switch the 250 V. A.C. mains through a triac, as will be appreciated by those skilled in the art.

By the use of a suitable electronic circuit within the electrical switch of the invention and a control unit connected to the switch it is possible for the machine equipped with the safety switch to be closed down completely or an alarm signal produced in the event that an attempt is made to over-ride the safety switch, e.g. by the use of a hand held magnet. A switch and control unit adapted to function in this way will now be described in more detail with reference to FIGS. 3 and 4 of the accompanying drawings.

Figure 3:
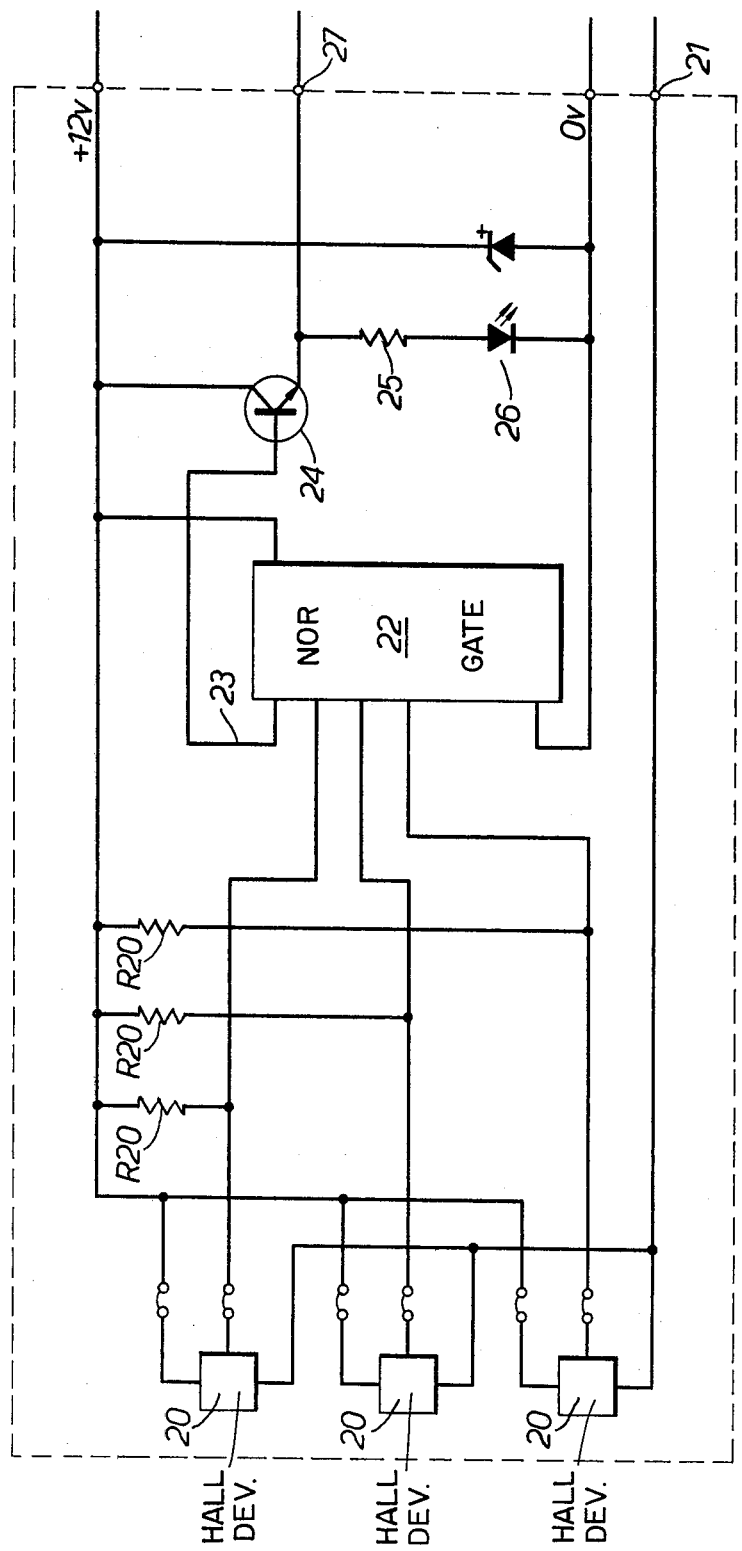
FIG. 3 illustrates the electronic circuit of an alternative switch incorporating three Hall effect devices.

FIG. 3 illustrates the electronic circuit which is included in one part of the switch and includes three Hall effect devices 20 any one of which can be reversed in physical location to the remaining two so as to respond to a magnetic pole of opposite polarity. Of course, the other part of the switch (not shown) will include permanent magnets positioned in an array so that each of the Hall effect devices 20 will be actuated when the two parts of the switch are placed together in correct alignment.

The Hall effect devices 20 are connected in parallel between the positive side of a 12 volt D.C. supply and a sensor current terminal 21. The outputs of the Hall devices are connected to the positive side of the D.C. supply through respective resistors R20 and to respective inputs of an integrated circuit element 22 connected across the D.C. supply. The output 23 of the device 22 is connected to the base of a power transistor 24 which is in series with a resistor 25 and light emitting diode 26 across the D.C. supply. Signal output terminal 27 is connected between the transistor 24 and the resistor 25 so as to provide a signal of either +12 V or 0 v according to the condition of the transistor 24. In use, the output terminals 21 and 27 are connected to a control unit, as will become clear from the following description in connection with FIG. 4.

In operation, when the two switch parts are separated the Hall devices 20 are non-conducting and provide signals of +12 V to the integrated circuit element 22 which operates as a NOR gate and accordingly does not emit any output to power transistor 24 which remains non-conducting. As a result, diode 26 is not illuminated, an output signal of 0 v is obtained at terminal 27 and a very low current signal is obtained at terminal 21. If the two switch parts are now brought together in proper position, the Hall devices 20 are actuated and conduct, the current flowing in the direction from their outputs to the sensor current return terminal 21. The voltage signals supplied to the integrated circuit element 22 all fall to 0 v and the element emits a signal to transistor 24 rendering it conductive whereby diode 26 illuminates and a +12 v signal is produced at terminal 27. If any one of the Hall devices 20 should not be activated, e.g. due to the wrong combination of magnetic poles being present in the switch part including the electronic circuit, its output will remain at +12 v so the NOR gate 22 fails to produce an output, transistor 24 does not switch to a conductive state and the output signal at terminal 27 remains at 0 v. However, if one or two of the Hall devices are activated they conduct and an increased sensor return current is produced at terminal 21.

Figure 4:
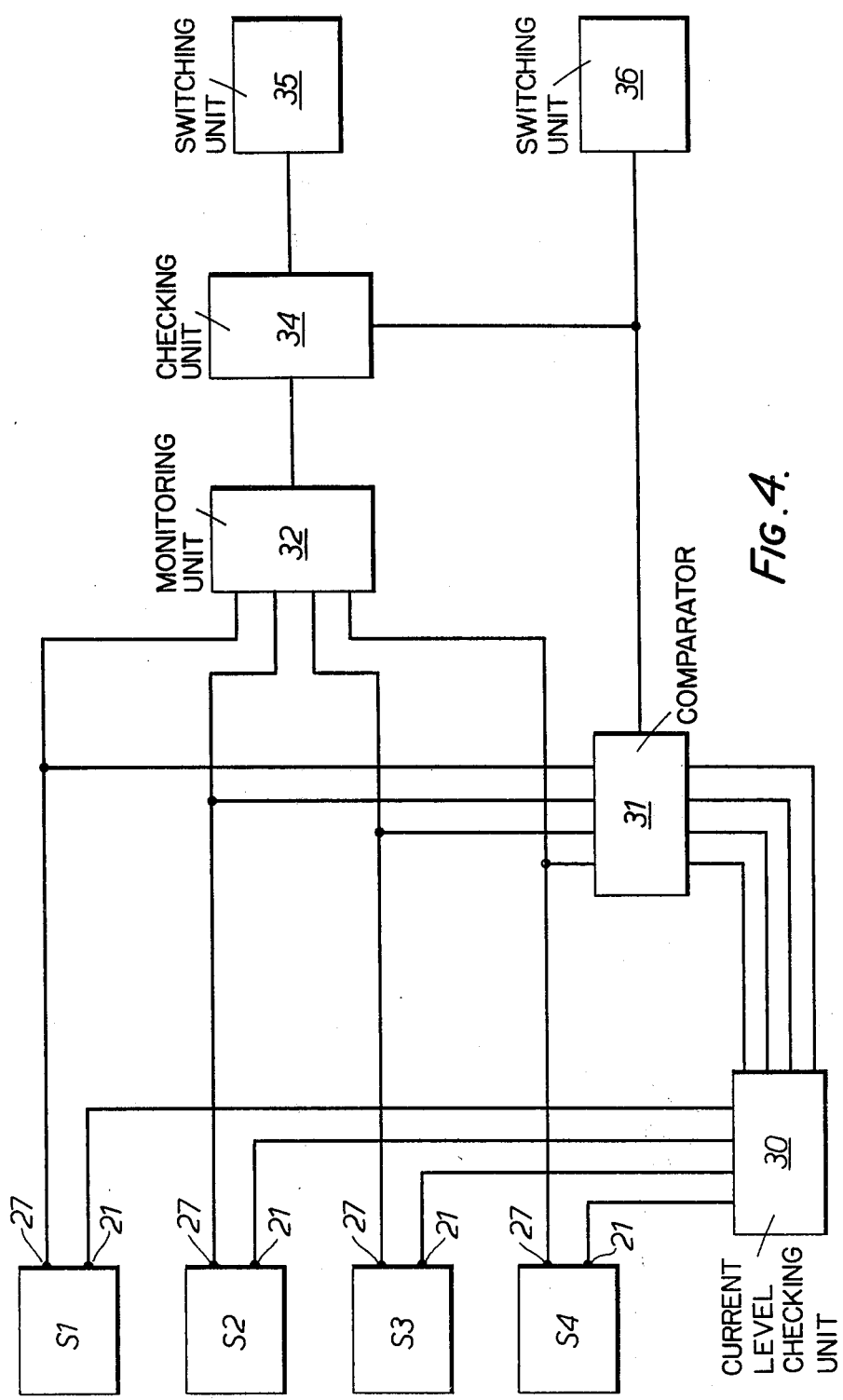
FIG. 4 is a schematic representation of a control circuit for use in an installation including four electric switches with electronic circuits as shown in FIG. 3.

It is possible for any particular machine installation to include more than one safety switch embodying the invention. For example, on an industrial machine there may be a number of safety checks which must be satisfied before it is safe to operate. In FIG. 4 there is illustrated diagrammatically a control circuit for an installation including for safety switches, each as shown in FIG. 3.

In FIG. 4 the switches are designated S1, S2, S3 and S4, and each has its own voltage signal output terminal 27 and return current output terminal 21. The latter terminals are connected to respective inputs of a current level checking unit 30 which compares each of the input currents separately with a predetermined current level, for example by comparing the voltage generated across a resistor by the input current with that set across a variable resistor, and provides an output signal of +12 v or 0 v according to whether the input current exceeds or is less than the said predetermined current level. The predetermined current level is set between the leakage current emitted from each switch terminal 21 when all the Hall devices 20 of the respective switch are all unactuated, and that sensor return current which is obtained when just one Hall device 20 of the switch is actuated, for reasons which will become clear.

The outputs of the current level checking unit 30 are coupled to respective first inputs of a comparator unit 31 having second inputs respectively connected to the voltage signal output terminals 27 of the four switches S1–S4. The unit 31 compares the signals received at each pair of first and second inputs and, if the voltage signals of any pair of inputs differ it produces an output signal of +12 v, otherwise the output of the comparator unit 31 is 0 v. Thus for each switch S1–S4, the voltage output signal is compared directly with the output signal produced for that switch by the current level checking unit 30.

The voltage signal terminals of the four switches S1–S4 are also connected to respective inputs of a switch operation monitoring unit 32 which produces an output of 0 v when all the inputs are at +12 v, and an output of +12 v for all other conditions. The outputs of the comparator unit 31 and the monitoring unit 32 are fed to respective inputs of a checking unit 34 which produces a signal of +12 v only when both inputs to unit 34 are at 0 v. The output of unit 34 is fed to a first switching unit 35 which responds to the +12 v signal to connect the electrical supply to the machine being controlled whereby the machine may be operated. The output from the comparator unit 31 is connected also to a second switching unit 36 which is responsive to a signal of +12 v to disconnect the power supply to the first switching unit 35 whereby the electricity supply to the machine cannot be completed and an alarm produced.

For the description of the control circuit operation let it first be assumed that all the switches S1–S4 are properly closed so all the Hall effect devices 20 are triggered and conducting. All the terminals 27 will be at +12 v while the terminals 21 will emit heavy sensor return currents which are greater than the predetermined current level set by the current checking unit 30 and the outputs from this unit will all be +12 v. As a result all the inputs of the comparator unit 31 are at +12 v and it produces an output of 0 v so that there is no actuation of switch unit 36. The four inputs of the switch operation monitoring unit 33 are also at +12 volts so its output is at 0 v, and as checking unit 34 has two 0 v inputs it emits a 12 v signal to actuate the switching unit 35 thereby connecting the power supply to the machine and enabling its operation.

If any one of the switches S1–S4 is not closed, e.g. due to a safety device of the machine having not been positioned correctly, the signal output terminal 27 of the respective switch remains at 0 v while only a very low sensor return current is produced at terminal 21. This current level is below that set by current level checking unit 30 and the corresponding output from this unit is 0 v. This output signal is compared with 0 v signal output from the unclosed switch by the comparator unit 31 and since the two input signals are the same the output of unit 32 remains at 0 v, and the second switching unit 36 is not actuated. The inputs to the switch operation monitoring unit 32 will include one at 0 v, due to the unclosed switch, and consequently it will produce an output signal of +12 v which is received by the checking unit 34. The output from this unit is therefore 0 v and switching unit 35 is not actuated so that the electricity supply to the machine is interrupted and it cannot be operated.

Suppose now that an attempt is made to over-ride the unclosed switch by presenting a hand-held permanent magnet to the switch part incorporating the Hall devices. One or two, but not all three of the Hall devices will be actuated so that the voltage output signal at terminal 27 of this switch remains at 0 v, but the sensor return current produded at terminal 21 is increased, due to the actuated Hall device(s), to a level above that set by current checking unit 30. Accordingly the corresponding output of unit 30 will be +12 v and this signal will be compared with the 0 v voltage output signal by the comparator unit 32. As the two inputs are unequal the output from this unit will go to +12 v thereby actuating switching unit 36 firstly to interrupt the power supply to switching unit 35 so that the current supply to the machine cannot be completed, and secondly to produce an alarm signal indicating that an attempt has been made to over-ride one of the safety switches. It is possible for the switching unit 36 to disconnect the power supply to the control unit so that attention by an operator is required before the machine may be set in operation again.

Although the control circuit has been described for four switches it can be adapted to suit any number of switches. Other modifications and improvements will occur to those skilled in the art. The current level checking unit 30, the comparator unit 31, the switch operation monitoring unit 32 and the checking unit 34 may be constituted by integrated circuit elements available on the market, whereas the two switching units 35,36 may comprise power transistors with series connected relays. For reasons of safety the comparator unit 31, switch operation monitoring unit 32, checking unit 34, and switching unit 35 may all be duplicated and connected in parallel in the control unit to provide essentially fail-safe operation. Furthermore, a circuit operation checking unit constituted by another integrated circuit element may be included and connected to corresponding points at different locations on the parallel circuits, the output of this unit being connected to the switching unit 36 to discontinue operation if a circuit malfunction is detected.

What is claimed is:

1. An electric switching device comprising two separate relatively movable parts, a first one of said parts including a housing having operative face means, at least two Hall effect devices fixed in the housing adjacent said operative face means and reversed in physical relationship to each other so as to be actuated by magnetic poles of opposite polarity presented against said face means, an electrical circuit including said Hall effect devices and electronic switching means having a normally conducting or non-conducting state and connected electrically to said Hall effect devices to change from said normal state to the opposite state only when all the Hall effect devices are actuated simultaneously, the other part of the device including operative face means adapted to cooperate with the face means of the first part, and a plurality of magnetic pole means fixed in position with respect to said face means for actuating respective Hall effect devices in said one part when said two parts are placed together in close proximity and with said face means cooperating with each other in predetermined spatial relationship.

2. An electric switching device according to claim 1, wherein the magnetic pole means are provided by one or more permanent magnets mounted in said other part.

3. An electric switching device according to claim 2, wherein said electrical circuit includes means to indicate the state of the switching means.

4. An electric switching device according to claim 1, wherein control means is connected electrically to said electrical circuit of said one part, said Hall effect devices are connected electrically in parallel with each other and to the control means for supplying to the control means a sensor return current signal dependent upon the condition of the Hall effect devices, and the control means includes checking means responsive to a sensor return current signal different to that expected for the existing condition of said switching means.

5. An electric switching device according to claim 4, wherein the switching device produces a voltage output signal dependent upon the state of the switching means, and the checking means includes a current level checking device for comparing the return sensor current with a preset level intermediate the return sensor current produced when all the Hall effect devices are unactuated and that produced when only one Hall effect device is actuated, and providing an output signal dependent upon whether the sensor return current is greater or less than the predetermined level, and a comparison device connected to receive and compare the voltage output signal and the output signal from the current level checking device.

6. An electric switching device according to claim 5, wherein the control means includes switching means connected to receive an output from said comparison device for interrupting a power supply of the power unit and/or actuating an alarm if at least one but not all of the Hall effect devices of the switching device are actuated.

7. An electric switching device according to claim 8, wherein at least one other similar switching device is connected to said control means, and said control means includes a switch operation monitoring device connected to receive the voltage output signal from each switching device, and a switching unit connected to the switch operation monitoring device to receive an output signal therefrom and be actuated thereby, said output signal being emitted by the switch operation monitoring unit only when all the switching devices have their two parts properly closed together.

8. An electric switching device according to claim 1, wherein said electrical circuit is connected to control means adapted to sense a condition when at least one but not all the Hall effect devices have been actuated and to interrupt a power supply and/or produce an alarm signal when said condition is sensed.

9. An electric switch according to claim 1, wherein said face means of said two parts are planar faces, said Hall effect devices are positioned side-by-side closely adjacent said planar face of said one part, and said magnetic pole means are located side-by-side at said planar face of said other part, whereby the Hall effect devices are actuated by respective pole means when the said planar faces are brought together in predetermined alignment with each other.

* * * * *